(12) United States Patent
Yang et al.

(10) Patent No.: US 11,953,645 B2
(45) Date of Patent: Apr. 9, 2024

(54) FOREIGN OBJECT DETECTION METHOD AND POWER SIDE CAPABLE OF DETECTING FOREIGN OBJECT

(71) Applicant: RICHTEK TECHNOLOGY CORPORATION, Zhubei (TW)

(72) Inventors: Shang-Te Yang, Tainan (TW); Ming-Jun Hsiao, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 237 days.

(21) Appl. No.: 17/681,722

(22) Filed: Feb. 26, 2022

(65) Prior Publication Data

US 2022/0299670 A1    Sep. 22, 2022

Related U.S. Application Data

(60) Provisional application No. 63/163,015, filed on Mar. 18, 2021.

(30) Foreign Application Priority Data

Jul. 29, 2021    (TW) ................. 110127962

(51) Int. Cl.
*G01V 3/08*      (2006.01)
*G01R 19/00*     (2006.01)
*G01R 19/165*    (2006.01)
*G01V 3/02*      (2006.01)

(52) U.S. Cl.
CPC ............ *G01V 3/088* (2013.01); *G01R 19/00* (2013.01); *G01R 19/165* (2013.01); *G01V 3/02* (2013.01)

(58) Field of Classification Search
CPC .......... G01V 3/088; G01V 3/02; G01R 19/00; G01R 19/165
See application file for complete search history.

(56) References Cited

U.S. PATENT DOCUMENTS

2019/0064245 A1* 2/2019 Chiang ................. G01R 31/52
2019/0079130 A1* 3/2019 Ko ......................... G01R 31/50

FOREIGN PATENT DOCUMENTS

TW    201500743 A    1/2015
TW    201629507 A    8/2016

* cited by examiner

*Primary Examiner* — Amy He
(74) *Attorney, Agent, or Firm* — Tung & Associates

(57) ABSTRACT

A foreign object detection method for detecting whether a foreign object exists on a function pin of a power supplier side or a power receiver side, wherein the power supplier side and the power receiver side are coupled to each other in a detachable fashion. The foreign object detection method includes: discharging a capacitor via the function pin, wherein the capacitor is electrically connected to the function pin; providing a sensing current flowing through the function pin, to charge the capacitor; sensing a voltage variation of the function pin during a predetermined period; and comparing the voltage variation with a predetermined variation, so as to determine whether a foreign object exists on the function pin.

16 Claims, 5 Drawing Sheets

FOREIGN OBJECT DETECTION METHOD AND POWER SIDE CAPABLE OF DETECTING FOREIGN OBJECT

CROSS REFERENCE

The present invention claims priority to U.S. 63/163,015 filed on Mar. 18, 2021 and claims priority to TW 110127962 filed on Jul. 29, 2021.

BACKGROUND OF THE INVENTION

Field of Invention

The present invention relates to a foreign object detection method and a power side capable of detecting a foreign object; particularly, it relates to such foreign object detection method and power side which are capable of determining whether a foreign object exists on a function pin according to a voltage variation of the function pin.

Description of Related Art

Please refer to FIG. 1, which shows a schematic diagram of a conventional power supply system. This prior art detects whether a foreign object exists by the following approach. First, this prior art controls a switch SW2 and a switch SW4, to discharge a pin CC2 via a resistor Rd. Subsequently, this prior art control the switch SW2 and the switch SW4 to set the pin CC2 to a floating state and a comparator COM2 compares a voltage level of the pin CC2 with a reference voltage Vref to output a comparison result Det_R. When a foreign object (such as moisture) exists between a pin VBUS of the power side and the pin CC2, a power supply voltage (e.g., a voltage of 5V provided by the pin VBUS) will be provided to the pin CC2 via the foreign object (such as moisture), such that the voltage level of the pin CC2 will be increased. Accordingly, when the comparator COM2 determines that the voltage level of the pin CC2 is higher than the reference voltage Vref, this conventional power supply system will determine that there is a foreign object (such as moisture) existing in the power side. However, the prior art shown in FIG. 1 has the following drawback that: it is required for the prior art to wait for the voltage level of the pin CC2 to reach a steady state before it can determine whether the voltage level of the pin CC2 is higher than the reference voltage Vref, and this is time consuming.

In view of the above, to overcome the drawback in the prior art, the present invention proposes a foreign object detection method and a power side which are capable of determining whether a foreign object exists on a function pin according to a voltage variation of the function pin.

SUMMARY OF THE INVENTION

From one perspective, the present invention provides a foreign object detection method, which is configured to operably detect whether a foreign object exists on a function pin of a power supplier side or a power receiver side, wherein the power supplier side and the power receiver side are coupled to each other in a detachable fashion; the foreign object detection method comprising: discharging a capacitor via the function pin, wherein the capacitor is electrically connected to the function pin; providing a sensing current flowing through the function pin, to charge the capacitor; sensing a voltage variation of the function pin during a predetermined period; and comparing the voltage variation with a predetermined variation, so as to determine whether the foreign object exists on the function pin.

From another perspective, the present invention provides a power side capable of detecting whether a foreign object exists on a function pin of the power side, wherein the power side is a power supplier side or a power receiver side, wherein the power supplier side and the power receiver side are coupled to each other in a detachable fashion, and wherein the power supplier side is configured to operably supply power to the power receiver side; the power side comprising: a discharging circuit including a switch, wherein the switch is electrically connected to the function pin and a capacitor, wherein the switch is configured to operably discharge the capacitor via the function pin, wherein the capacitor is electrically connected to the function pin; a current source circuit, which is electrically connected to the function pin and the capacitor, wherein the current source circuit is configured to operably provide a sensing current flowing through the function pin, to charge the capacitor; and a foreign object detection circuit, which is configured to operably sense a voltage variation of the function pin during a predetermined period and is configured to operably compare the voltage variation with a predetermined variation, so as to determine whether the foreign object exists on the function pin.

In one embodiment, the voltage variation is determined according to a capacitance of the capacitor.

In one embodiment, the power supplier side or the power receiver side is a universal serial bus (USB), and wherein the function pin includes: a VBUS pin of the USB, a DP pin of the USB, a DM pin of the USB, a CC1 pin of the USB, a CC2 pin of the USB, a SBU1 pin of the USB or a SBU2 pin of the USB.

In one embodiment, the step of sensing the voltage variation of the function pin during the predetermined period includes the following steps: sensing an initial voltage of the function pin at a starting time point of the predetermined period, wherein the starting time point is posterior to the step of discharging the capacitor via the function pin, and the starting time point is prior to the step of providing the sensing current flowing through the function pin to charge the capacitor; sensing a duration voltage of the function pin at a predetermined time point of the predetermined period; and sensing a termination voltage of the function pin at a termination time point of the predetermined period, wherein the termination time point is posterior to the predetermined time point.

In one embodiment, the voltage variation includes: a first voltage variation and a second voltage variation, wherein the first voltage variation is a difference between the termination voltage and the initial voltage, and wherein the second voltage variation is a difference between the termination voltage and the duration voltage.

In one embodiment, the step of sensing the voltage variation of the function pin during the predetermined period further includes the following step: posterior to the step of sensing the termination voltage of the function pin at the termination time point of the predetermined period, discharging the capacitor via the function pin.

In one embodiment, the step of comparing the voltage variation with the predetermined variation, so as to determine whether the foreign object exists on the function pin includes the following steps: comparing the first voltage variation with a first predetermined variation of the predetermined variation; when the first voltage variation is not greater than the first predetermined variation, comparing the second voltage variation with a second predetermined variation of the predetermined variation; and when the second voltage variation is not greater than the second predetermined variation, determining that the foreign object exists on the function pin.

In one embodiment, a duration between the starting time point and the termination time point is not longer than 100 milliseconds.

In one embodiment, the switch includes: a high voltage metal oxide semiconductor (MOS) device or a low voltage MOS device.

In one embodiment, the foreign object detection circuit includes: an analog-to-digital converter or a comparator.

The present invention is advantageous in that it is not required to wait for a voltage of a function pin of the present invention to reach a steady state. Hence, the present invention is capable of detecting whether a foreign object exists on the function pin within a short period.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
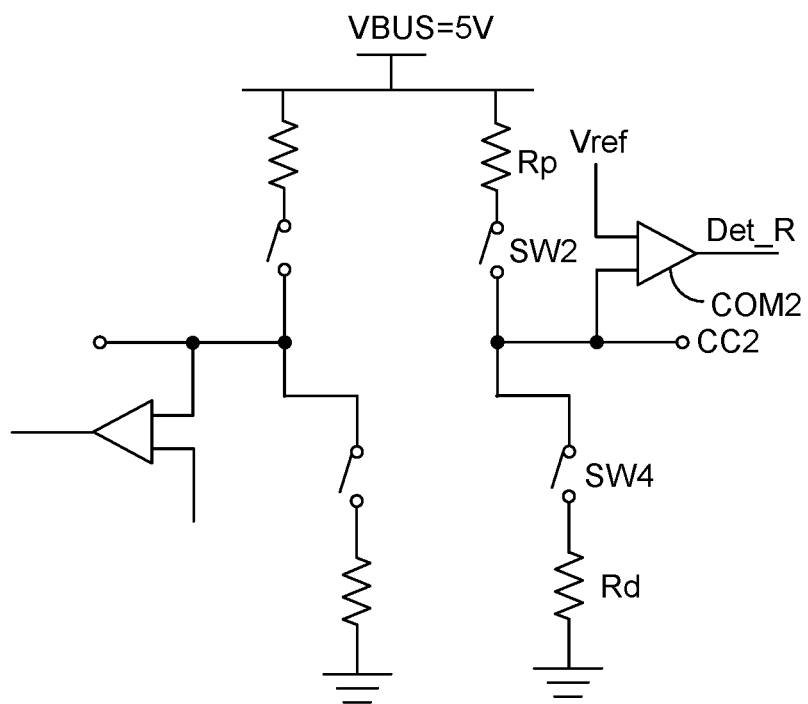
FIG. 1 shows a schematic diagram of a conventional power supply system.
Figure 2:
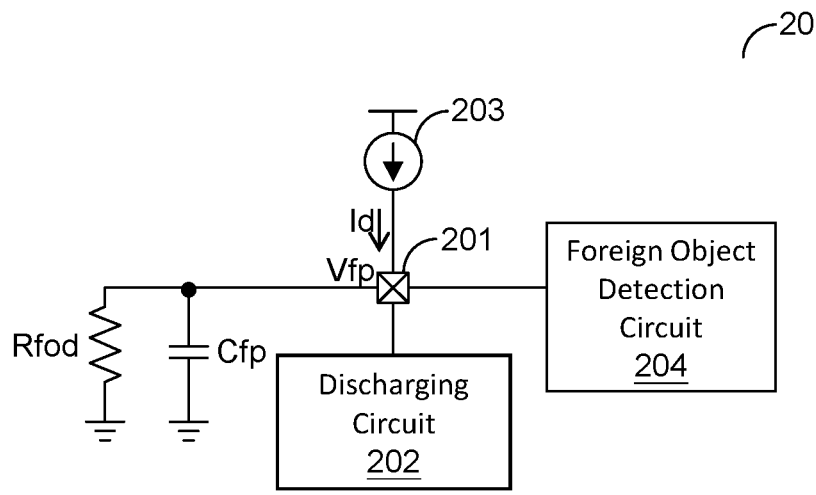
FIG. 2 shows a schematic block diagram of a power side capable of detecting a foreign object according to an embodiment of the present invention.

Please refer to FIG. 2, which shows a schematic block diagram of a power side 20 capable of detecting a foreign object according to an embodiment of the present invention, that is, the power side 20 of the present invention as shown in FIG. 2 has an ability to detect whether a foreign object exists on a function pin 201 of the power side 20. In one embodiment, the power side 20 can be for example a power supplier side or a power receiver side, wherein the power supplier side and the power receiver side are coupled to each other in a detachable fashion and the power supplier side is configured to operably supply power to the power receiver side. In one embodiment, the power supplier side or the power receiver side can be for example a universal serial bus (USB).

As shown in FIG. 2, the power side 20 comprises: a discharging circuit 202, a current source circuit 203 and a foreign object detection circuit 204. In one embodiment, the discharging circuit 202 includes a switch, which is coupled to a ground level. In one embodiment, the switch can be, for example but not limited to, a high voltage metal oxide semiconductor (MOS) device or a low voltage MOS device. The discharging circuit 202 (e.g. a switch) is electrically connected to the function pin 201 and a capacitor Cfp. The capacitor Cfp is electrically connected to the function pin 201. The discharging circuit 202 (e.g. a switch) is configured to operably discharge the capacitor Cfp via the function pin 201.

The current source circuit 203 is electrically connected to the function pin 201 and the capacitor Cfp. The current source circuit 203 is configured to operably provide a sensing current Id flowing through the function pin 201, so as to charge the capacitor Cfp. In one embodiment, the current source circuit 203 can be, for example but not limited to, a low dropout (LDO) regulator. The foreign object detection circuit 204 is coupled to the function pin 201. The foreign object detection circuit 204 is configured to operably sense a variation of a voltage Vfp (referred to as "voltage variation") of the function pin 201 during a predetermined period and is configured to operably compare the voltage variation with a predetermined variation, so as to determine whether the foreign object exists on the function pin 201. In one embodiment, the foreign object detection circuit 204 can be, for example but not limited to, an analog-to-digital converter (ADC) or a comparator.

In one embodiment, the above-mentioned predetermined voltage variation is determined according to a capacitance of the capacitor Cfp. In one embodiment, the function pin 201 includes: a VBUS pin of the USB, a DP pin of the USB, a DM pin of the USB, a CC1 pin of the USB, a CC2 pin of the USB, a SBU1 pin of the USB or a SBU2 pin of the USB.

Figure 3:
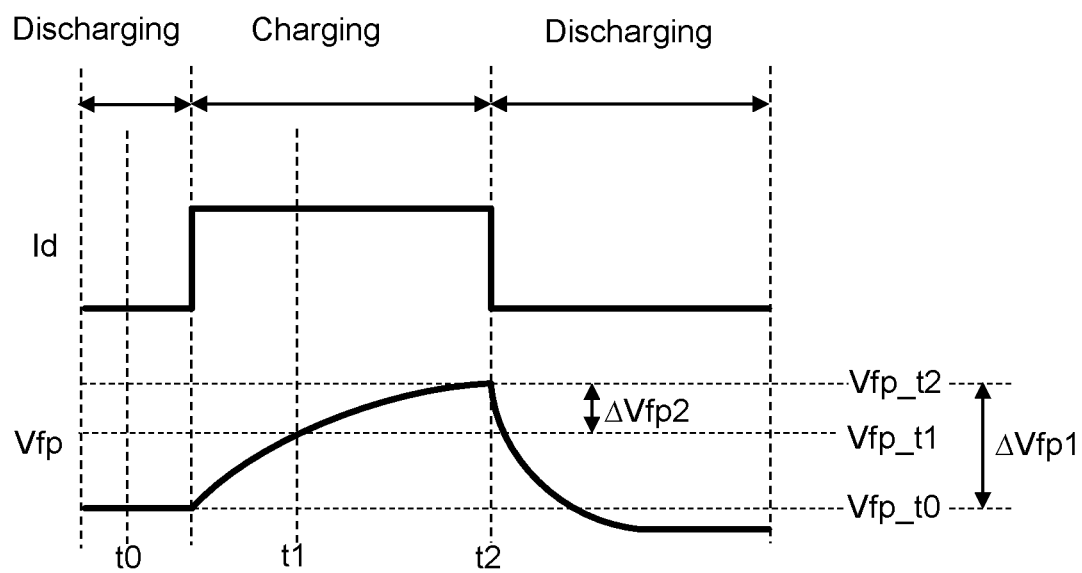
FIG. 3 illustrates a signal waveform diagram depicting the operation of a power side capable of detecting a foreign object of FIG. 2.

Please refer to FIG. 3, which illustrates a signal waveform diagram depicting the operation of a power side capable of detecting a foreign object of FIG. 2. Please refer to FIG. 2 in conjugation with FIG. 3. The foreign object detection circuit 204 is configured to operably sense the voltage Vfp variation of the function pin 201 during the predetermined period via following steps: first, the foreign object detection circuit 204 senses an initial voltage Vfp_t0 of the function pin 201 at a starting time point t0 of the predetermined period, wherein the starting time point t0 is posterior to a step of discharging the capacitor Cfp via the function pin 201, and is prior to a step of providing a sensing current Id through the function pin 201 to charge the capacitor Cfp. Next, the foreign object detection circuit 204 senses a duration voltage Vfp_t1 of the function pin 201 at a predetermined time point t1 in the predetermined period. Next, the foreign object detection circuit 204 senses a termination voltage Vfp_t2 of the function pin 201 at a termination time point t2 of the predetermined period. The termination time point t2 is posterior to the predetermined time point t1.

As shown in FIG. 2 and FIG. 3, in one embodiment, the process of sensing the voltage variation of the function pin 201 during the predetermined period further includes the following step: after the step of sensing the termination voltage Vfp_t2 of the function pin 201 at the termination time point t2 of the predetermined period, discharging the capacitor Cfp via the function pin 201. In one embodiment, a time duration from the starting time point t0 to the termination time point t2 is, for example, not longer than 100 milliseconds.

Figure 4:
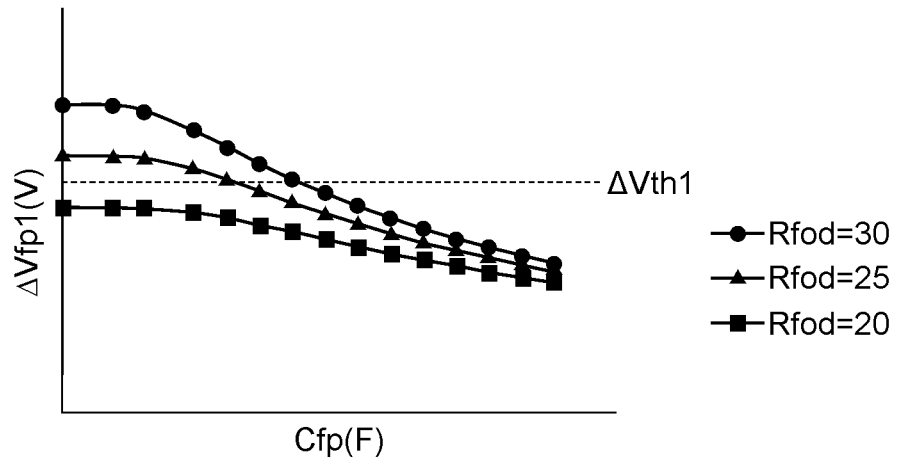
FIG. 4 illustrates a curve of first voltage variation of a function pin of a power side versus capacitance.
Figure 5:
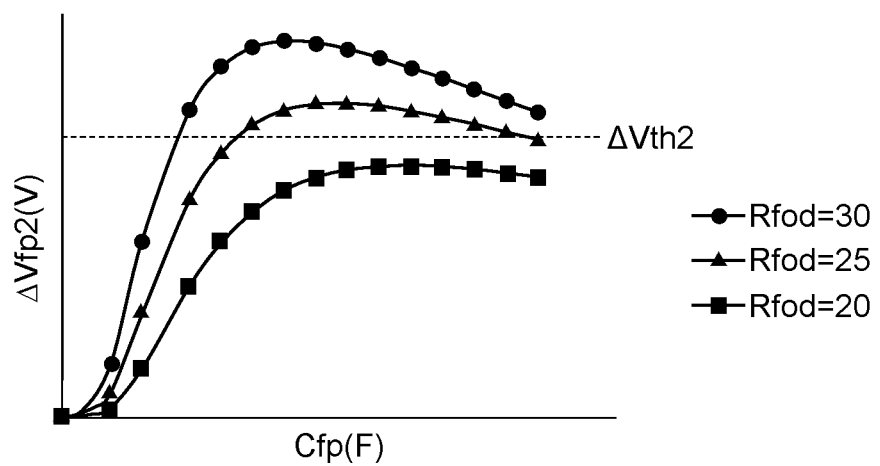
FIG. 5 illustrates a curve of second voltage variation of a function pin of a power side versus capacitance.

In one embodiment, the voltage variation includes a first voltage variation $\Delta Vfp1$ and a second voltage variation $\Delta Vfp2$. The first voltage variation $\Delta Vfp1$ is a difference between the termination voltage Vfp_t2 and the initial voltage Vfp_t0, and the second voltage variation $\Delta Vfp2$ is a difference between the termination voltage Vfp_t2 and the duration voltage Vfp_t1. FIG. 4 illustrates a curve of the first voltage variation ΔVfp1 of the function pin 201 of the power side 20 versus the capacitance Cfp. FIG. 5 illustrates a curve of the second voltage variation ΔVfp2 of the function pin 201 of the power side 20 versus the capacitance Cfp. In one embodiment, the relationship between the first voltage variation ΔVfp1 and the capacitance Cfp shown in FIG. 4 can be represented by the following equation:

$$\Delta Vfp1 = Id * Rfod\left(1 - e^{-\frac{t2}{Rfod*Cfp}}\right), \quad (1)$$

wherein Rfod denotes the resistance of the foreign object, t2 denotes a termination time point, Id denotes the sensing current. In one embodiment, the relationship between the second voltage variation ΔVfp2 and the capacitance Cfp shown in FIG. 5 can be represented by the following equation:

$$\Delta Vfp2 = Id * Rfod\left(e^{-\frac{t1}{Rfod*Cfp}} - e^{-\frac{t2}{Rfod*Cfp}}\right), \quad (2)$$

wherein Rfod denotes the resistance of the foreign object, t1 denotes the predetermined time point, t2 denotes a termination time point. Equations (1) and (2) can be derived as follows:

$$Vfp\_t = Vfp\_t0 + Id * Rfod\left(1 - e^{-\frac{t}{Rfod*Cfp}}\right)$$

$$Vfp\_t1 = Vfp\_t0 + Id * Rfod\left(1 - e^{-\frac{t1}{Rfod*Cfp}}\right)$$

$$Vfp\_t2 = Vfp\_t0 + Id * Rfod\left(1 - e^{-\frac{t2}{Rfod*Cfp}}\right)$$

$$\Delta Vfp1 = Vfp\_t2 - Vfp\_t0 + Id * Rfod\left(1 - e^{-\frac{t2}{Rfod*Cfp}}\right)$$

$$\Delta Vfp2 = Vfp\_t2 - Vfp\_t1 + Id * Rfod\left(e^{-\frac{t1}{Rfod*Cfp}} - e^{-\frac{t2}{Rfod*Cfp}}\right),$$

wherein Vfp_t denotes a voltage of the function pin 201 at any time point t, Vfp_t0 denotes the initial voltage of the function pin 201 at the starting time point t0 (where t=0), Vfp_t1 denotes the duration voltage of the function pin 201 at the predetermined time point t1, and Vfp_t2 denotes the termination voltage of the function pin 201 at the termination time point t2.

Please refer to FIG. 3 in conjugation with FIG. 4 and FIG. 5. The foreign object detection circuit 204 is configured to operably compare the voltage variation with the predetermined variation, so as to determine whether a foreign object exists on the function pin 20, via the following steps: first, the foreign object detection circuit 204 compares the first voltage variation ΔVfp1 with a first predetermined variation ΔVth1 of the predetermined variation. Next, when the first voltage variation ΔVfp1 is not greater than the first predetermined variation ΔVth1, the foreign object detection circuit 204 compares the second voltage variation ΔVfp2 with a second predetermined variation ΔVth2 of the predetermined variation. Next, when the second voltage variation ΔVfp2 is not greater than the second predetermined variation ΔVth2, the foreign object detection circuit 204 determines that there is a foreign object existing on the function pin 201.

Figure 6:
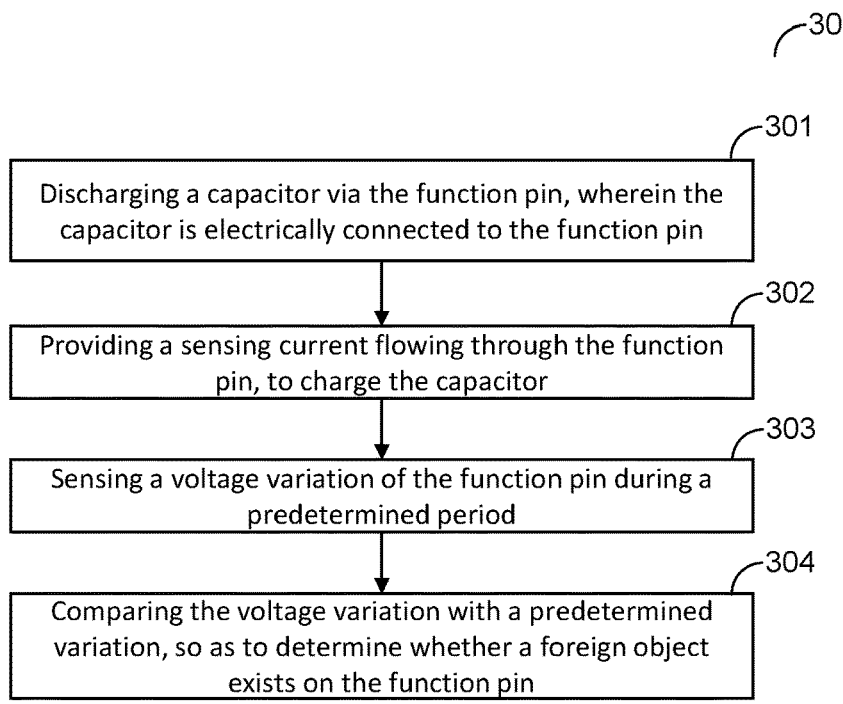
FIG. 6 to FIG. 9 show flowchart diagrams of a foreign object detection method.

Please refer to FIG. 6 to FIG. 9, which show flowchart diagrams of a foreign object detection method according to one embodiment of the present invention. As shown in FIG. 6, the foreign object detection method 30 of the present invention comprises the following steps: step 301: discharging a capacitor via the function pin, wherein the capacitor is electrically connected to the function pin. Next, proceeding to step 302: providing a sensing current flowing through the function pin, to charge the capacitor. Next, proceeding to step 303: sensing a voltage variation of the function pin during a predetermined period. Next, proceeding to step 304: comparing the voltage variation with a predetermined variation, so as to determine whether a foreign object exists on the function pin.

Figure 7:
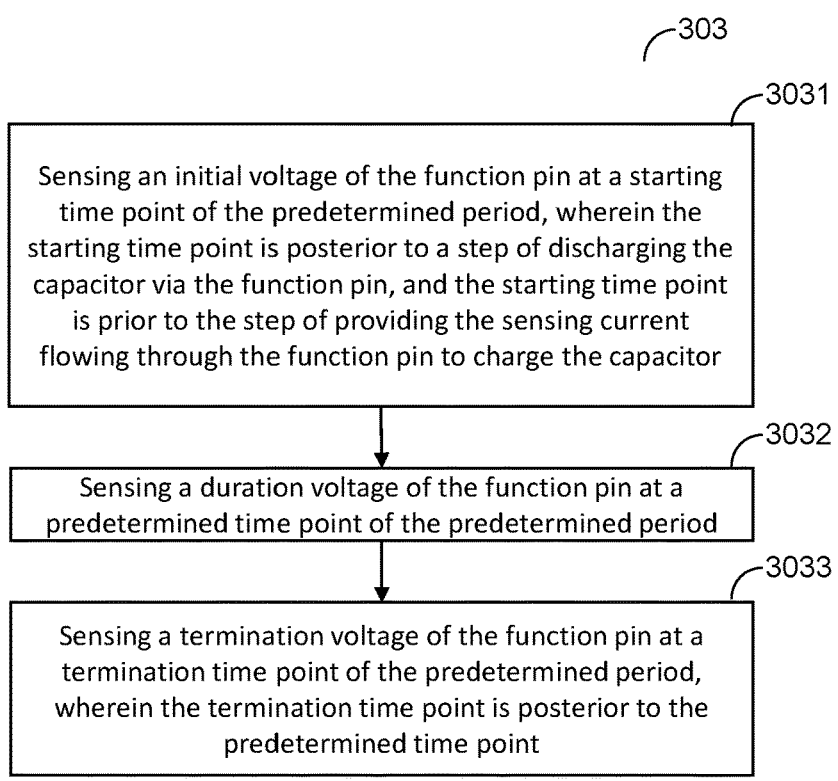

Referring to FIG. 7, in one embodiment, the step 303 includes step 3031, step 3032 and step 3033. First, in step 3031: sensing an initial voltage of the function pin at a starting time point of the predetermined period, wherein the starting time point is posterior to a step of discharging the capacitor via the function pin, and the starting time point is prior to the step of providing the sensing current flowing through the function pin to charge the capacitor. Next, proceeding to step 3032: sensing a duration voltage of the function pin at a predetermined time point of the predetermined period. Next, proceeding to step 3033: sensing a termination voltage of the function pin at a termination time point of the predetermined period, wherein the termination time point is posterior to the predetermined time point.

Figure 8:
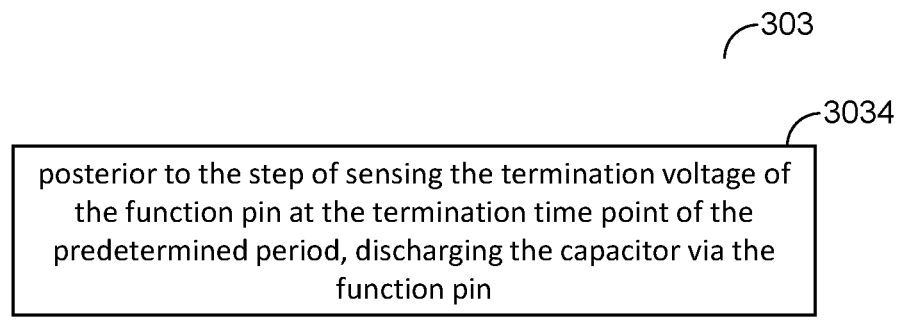
Figure 9:
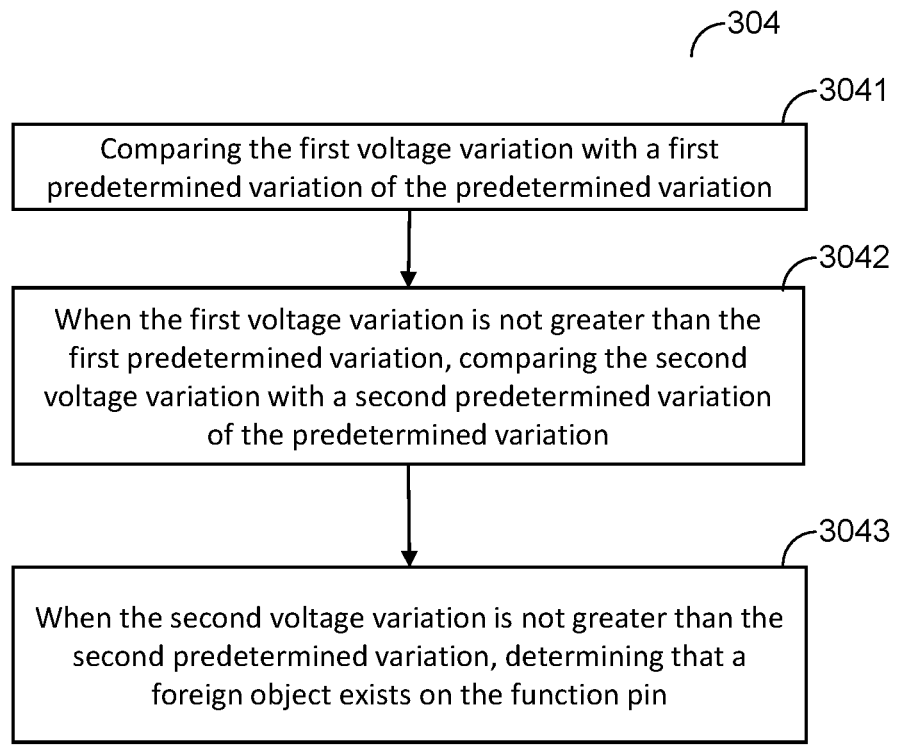

As shown in FIG. 8, in one embodiment, the step 303 further includes step 3034. In the step 3034: posterior to the step of sensing the termination voltage of the function pin at the termination time point of the predetermined period, discharging the capacitor via the function pin. As shown in FIG. 9, in one embodiment, the step 304 includes step 3041, step 3042 and step 3043. First, in step 3041: comparing the first voltage variation with a first predetermined variation of the predetermined variation. Next, proceeding to step 3042: when the first voltage variation is not greater than the first predetermined variation, comparing the second voltage variation with a second predetermined variation of the predetermined variation. Next, proceeding to step 3043: when the second voltage variation is not greater than the second predetermined variation, determining that a foreign object exists on the function pin.

The present invention provides a foreign object detection method and a power side which are capable of detecting a foreign object, as described above. The present invention detects a voltage variation of the function pin rather than a steady voltage of the function pin. The present invention is advantageous in that it is not required to wait for a voltage of a function pin of the present invention to reach a steady state. Hence, the present invention is capable of detecting whether a foreign object exists on the function pin within a short period.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A foreign object detection method, which is configured to operably detect whether a foreign object exists on a function pin of a power supplier side or a power receiver side, wherein the power supplier side and the power receiver side are coupled to each other in a detachable fashion; the foreign object detection method comprising:
   discharging a capacitor via the function pin, wherein the capacitor is electrically connected to the function pin;
   providing a sensing current flowing through the function pin, to charge the capacitor;
   sensing a voltage variation of the function pin during a predetermined period; and
   comparing the voltage variation with a predetermined variation, so as to determine whether the foreign object exists on the function pin;
   wherein the step of sensing the voltage variation of the function pin during the predetermined period includes the following steps:
   sensing an initial voltage of the function pin at a starting time point of the predetermined period, wherein the starting time point is posterior to the step of discharging the capacitor via the function pin, and the starting time point is prior to the step of providing the sensing current flowing through the function pin to charge the capacitor;
   sensing a duration voltage of the function pin at a predetermined time point of the predetermined period; and
   sensing a termination voltage of the function pin at a termination time point of the predetermined period, wherein the termination time point is posterior to the predetermined time point.

2. The foreign object detection method of claim 1, wherein the voltage variation is determined according to a capacitance of the capacitor.

3. The foreign object detection method of claim 1, wherein the power supplier side or the power receiver side is a universal serial bus (USB), and wherein the function pin includes: a VBUS pin of the USB, a DP pin of the USB, a DM pin of the USB, a CC1 pin of the USB, a CC2 pin of the USB, a SBU1 pin of the USB or a SBU2 pin of the USB.

4. The foreign object detection method of claim 1, wherein the voltage variation includes: a first voltage variation and a second voltage variation, wherein the first voltage variation is a difference between the termination voltage and the initial voltage, and wherein the second voltage variation is a difference between the termination voltage and the duration voltage.

5. The foreign object detection method of claim 4, wherein the step of comparing the voltage variation with the predetermined variation, so as to determine whether the foreign object exists on the function pin includes the following steps:
   comparing the first voltage variation with a first predetermined variation of the predetermined variation;
   when the first voltage variation is not greater than the first predetermined variation, comparing the second voltage variation with a second predetermined variation of the predetermined variation; and
   when the second voltage variation is not greater than the second predetermined variation, determining that the foreign object exists on the function pin.

6. The foreign object detection method of claim 1, wherein the step of sensing the voltage variation of the function pin during the predetermined period further includes the following step:
   posterior to the step of sensing the termination voltage of the function pin at the termination time point of the predetermined period, discharging the capacitor via the function pin.

7. The foreign object detection method of claim 1, wherein a duration between the starting time point and the termination time point is not longer than 100 milliseconds.

8. A power side detection circuit capable of detecting whether a foreign object exists on a function pin of a power side circuitry, wherein the power side circuitry is a power supplier side circuitry or a power receiver side circuitry, wherein the power supplier side circuitry and the power receiver side circuitry are coupled to each other in a detachable fashion, and wherein the power supplier side circuitry is configured to operably supply power to the power receiver side circuitry; the power side detection circuit comprising:
   a discharging circuit including a switch, wherein the switch is electrically connected to the function pin and a capacitor, wherein the switch is configured to operably discharge the capacitor via the function pin, wherein the capacitor is electrically connected to the function pin;
   a current source circuit, which is electrically connected to the function pin and the capacitor, wherein the current source circuit is configured to operably provide a sensing current flowing through the function pin, to charge the capacitor; and
   a foreign object detection circuit, which is configured to operably sense a voltage variation of the function pin during a predetermined period and is configured to operably compare the voltage variation with a predetermined variation, so as to determine whether the foreign object exists on the function pin;
   wherein the foreign object detection circuit is configured to operably sense the voltage variation of the function pin during the predetermined period via the following steps:
   sensing an initial voltage of the function pin at a starting time point of the predetermined period, wherein the starting time point is posterior to the step of discharging the capacitor via the function pin, and the starting time point is prior to the step of providing the sensing current flowing through the function pin to charge the capacitor;
   sensing a duration voltage of the function pin at a predetermined time point of the predetermined period; and
   sensing a termination voltage of the function pin at a termination time point of the predetermined period, wherein the termination time point is posterior to the predetermined time point.

9. The power side detection circuit of claim 8, wherein the voltage variation is determined according to a capacitance of the capacitor.

10. The power side detection circuit of claim 8, wherein the power supplier side or the power receiver side is a universal serial bus (USB), and wherein the function pin includes: a VBUS pin of the USB, a DP pin of the USB, a DM pin of the USB, a CC1 pin of the USB, a CC2 pin of the USB, a SBU1 pin of the USB or a SBU2 pin of the USB.

11. The power side detection circuit of claim 8, wherein the voltage variation includes: a first voltage variation and a second voltage variation, wherein the first voltage variation is a difference between the termination voltage and the initial voltage, and wherein the second voltage variation is a difference between the termination voltage and the duration voltage.

12. The power side detection circuit of claim 11, wherein the foreign object detection circuit is configured to operably compare the voltage variation with the predetermined variation, so as to determine whether the foreign object exists on the function pin via the following steps:
    comparing the first voltage variation with a first predetermined variation of the predetermined variation;
    when the first voltage variation is not greater than the first predetermined variation, comparing the second voltage variation with a second predetermined variation of the predetermined variation; and
    when the second voltage variation is not greater than the second predetermined variation, determining that the foreign object exists on the function pin.

13. The power side detection circuit of claim 8, wherein the foreign object detection circuit is configured to operably sense the voltage variation of the function pin during the predetermined period further via the following step:
    posterior to the step of sensing the termination voltage of the function pin at the termination time point of the predetermined period, discharging the capacitor via the function pin.

14. The power side detection circuit of claim 8, wherein a duration between the starting time point and the termination time point is not longer than 100 milliseconds.

15. The power side detection circuit of claim 8, wherein the switch includes: a high voltage metal oxide semiconductor (MOS) device or a low voltage MOS device.

16. The power side detection circuit of claim 8, wherein the foreign object detection circuit includes: an analog-to-digital converter or a comparator.

* * * * *